(12) United States Patent
Sharf (10) Patent No.: US 11,864,353 B2
(45) Date of Patent: Jan. 2, 2024

(54) HEAT EXCHANGE ASSEMBLY

(71) Applicant: TE Connectivity Services GmbH, Schaffhausen (CH)

(72) Inventor: Alex Michael Sharf, Harrisburg, PA (US)

(73) Assignee: TE CONNECTIVITY SOLUTIONS GmbH, Schaffhausen (CH)

( * ) Notice: Subject to any disclaimer, the term of this patent is extended or adjusted under 35 U.S.C. 154(b) by 225 days.

(21) Appl. No.: 17/476,440

(22) Filed: Sep. 15, 2021

(65) Prior Publication Data
US 2023/0102497 A1    Mar. 30, 2023

(51) Int. Cl.
*H05K 7/20*        (2006.01)
*H05K 9/00*        (2006.01)

(52) U.S. Cl.
CPC ......... *H05K 7/2039* (2013.01); *H05K 9/0015* (2013.01)

(58) Field of Classification Search
CPC .. H05K 7/2039; H05K 9/0015; G02B 6/4277; G02B 6/4269; G02B 6/4261
See application file for complete search history.

(56) References Cited

U.S. PATENT DOCUMENTS

| | | | | |
|---|---|---|---|---|
| 3,993,125 | A * | 11/1976 | Rhodes | F28F 1/128 165/153 |
| 5,332,032 | A * | 7/1994 | Beddome | F28D 1/0341 165/78 |
| 5,930,115 | A * | 7/1999 | Tracy | H05K 7/20727 361/689 |
| 7,224,582 | B1 * | 5/2007 | Saturley | H05K 9/0049 361/679.54 |
| 7,836,942 | B2 * | 11/2010 | Cannas | F24H 1/43 165/181 |
| 9,620,890 | B1 * | 4/2017 | Vino, IV | G02B 6/4293 |
| 9,853,435 | B1 * | 12/2017 | Burkman | H01M 10/625 |
| 10,477,729 | B2 | 11/2019 | Han et al. | |
| 10,575,442 | B2 | 2/2020 | Bucher | |
| 10,770,842 | B2 | 9/2020 | Jin et al. | |

(Continued)

*Primary Examiner* — Timothy J Thompson
*Assistant Examiner* — Rhadames Alonzo Miller (57) ABSTRACT

A heat exchange assembly includes a plate stack having fin plates and spacer plates interleaved with the fin plates in the plate stack. Each fin plate has fin sides extending between a fin lower edge and a fin upper edge. Each spacer plate has spacer sides extending between a spacer lower edge and a spacer upper edge. The fin upper edges of the fin plates are located above the spacer upper edges. Air flow channels are formed in gaps between the fin plates above the spacer plates. The fin lower edges and the spacer lower edges define a lower thermal interface configured to be in thermal communication with an electrical component to dissipate heat from the electrical component. The fin plates are independently movable relative to the spacer plates in the plate stack to independently articulate the fin lower edges and the spacer lower edges at the lower thermal interface. The heat exchange assembly includes a plate stabilizer structure positioning the fin upper edges relative to each other. The plate stabilizer structure includes plate stabilizers having stabilizing fingers. The stabilizing fingers coupled to at least two fin plates to control spacing of the fin upper edges of the corresponding fin plates.

21 Claims, 8 Drawing Sheets

(56) References Cited

U.S. PATENT DOCUMENTS

| | | | |
|---|---|---|---|
| 2005/0281001 A1* | 12/2005 | Dittus | H01L 23/4093 |
| | | | 361/710 |
| 2008/0185132 A1* | 8/2008 | Cannas | F28F 1/16 |
| | | | 165/163 |
| 2008/0186039 A1* | 8/2008 | Cannas | F28F 1/16 |
| | | | 324/750.28 |
| 2009/0279261 A1* | 11/2009 | Seynaeve | H05K 7/20454 |
| | | | 361/704 |
| 2011/0058336 A1* | 3/2011 | Sundstrom | H05K 7/20436 |
| | | | 361/710 |
| 2013/0180697 A1* | 7/2013 | Chen | H01L 21/4882 |
| | | | 165/185 |
| 2014/0286613 A1* | 9/2014 | Ito | G02B 6/4292 |
| | | | 385/88 |
| 2016/0064873 A1* | 3/2016 | Bucher | H01R 13/6658 |
| | | | 439/59 |
| 2017/0094830 A1* | 3/2017 | Bucher | H05K 7/20445 |
| 2017/0164511 A1* | 6/2017 | Bucher | G02B 6/4272 |
| 2018/0259731 A1* | 9/2018 | Dupeux | G02B 6/4271 |
| 2018/0306482 A1* | 10/2018 | Ball | F25D 25/021 |
| 2019/0230817 A1* | 7/2019 | Han | G02B 6/4269 |
| 2021/0084791 A1* | 3/2021 | Bucher | H05K 7/205 |
| 2022/0030739 A1* | 1/2022 | Bucher | H05K 7/20472 |
| 2022/0082771 A1* | 3/2022 | Galbraith | G02B 6/4269 |

* cited by examiner

HEAT EXCHANGE ASSEMBLY

BACKGROUND OF THE INVENTION

The subject matter herein relates generally to heat exchange assemblies that can be used with receptacle connector assemblies.

Some communication systems utilize receptacle assemblies having communication connectors to interconnect various components of the system for data communication. The receptacle assemblies include receptacle cages that receive pluggable modules, such as I/O modules, that are electrically connected to the communication connector. The receptacle cages provide electrical shielding, such as EMI shielding, for the pluggable modules. Some known communication systems provide heat transfer assemblies attached to the receptacle cage to dissipate heat from the pluggable module. The heat transfer assemblies are typically mounted to the top of receptacle cage by a clip or spring that provides downward force to press the heat sink into the receptacle cage to interface with the pluggable module and force the heat sink through an opening in the top wall of the receptacle cage to interface with the pluggable module. Known receptacle cages are not without disadvantages. For instance, the opening in the top wall of the receptacle cage provides an area for potential EMI leakage.

A need remains for a receptacle cage having improved EMI shielding.

BRIEF DESCRIPTION OF THE INVENTION

In one embodiment, a heat exchange assembly is provided and includes a plate stack having a top and a bottom. The plate stack includes a fin plates and spacer plates interleaved with the fin plates in the plate stack. Each fin plate has fin sides extending between a fin lower edge and a fin upper edge. Each spacer plate has spacer sides extending between a spacer lower edge and a spacer upper edge. The fin upper edges of the fin plates are located above the spacer upper edges. Air flow channels are formed in gaps between the fin plates above the spacer plates. The fin lower edges and the spacer lower edges define a lower thermal interface configured to be in thermal communication with an electrical component to dissipate heat from the electrical component. The fin plates are independently movable relative to the spacer plates in the plate stack to independently articulate the fin lower edges and the spacer lower edges at the lower thermal interface. The heat exchange assembly includes a plate stabilizer structure positioning the fin upper edges relative to each other. The plate stabilizer structure includes plate stabilizers having stabilizing fingers. The stabilizing fingers coupled to at least two fin plates to control spacing of the fin upper edges of the corresponding fin plates.

In a further embodiment, a heat exchange assembly is provided and includes a plate stack having a top and a bottom. The plate stack includes a fin plates and spacer plates interleaved with the fin plates in the plate stack. Each fin plate has fin sides extending between a fin lower edge and a fin upper edge. Each spacer plate has spacer sides extending between a spacer lower edge and a spacer upper edge. The fin upper edges of the fin plates located above the spacer upper edges. Air flow channels formed in gaps between the fin plates above the spacer plates. The fin lower edges and the spacer lower edges define a lower thermal interface configured to be in thermal communication with an electrical component to dissipate heat from the electrical component. The fin plates are independently movable relative to the spacer plates in the plate stack to independently articulate the fin lower edges and the spacer lower edges at the lower thermal interface. The heat exchange assembly includes a plate stabilizer structure positioning the fin upper edges relative to each other. The plate stabilizer structure includes plate stabilizers. Each plate stabilizer extending from the fin upper edge of the corresponding fin plate. Each plate stabilizer includes a stabilizing finger engaging the adjacent fin plate to control spacing of the adjacent fin plate with the corresponding fin plate. The plate stabilizer is stamped and formed with the corresponding fin plate as a unitary, monolithic structure.

In a further embodiment, a receptacle connector assembly is provided and includes a receptacle cage including cage walls includes a top wall. The cage walls form a module channel configured to receive a pluggable module. The cage walls extend between a front end and a rear end of the receptacle cage. The top wall includes an opening open to the pluggable module. The receptacle connector includes a heat exchange assembly coupled to the top wall of the receptacle cage to dissipate heat from the pluggable module. The heat exchange assembly includes a plate stack having a top and a bottom. The plate stack includes a fin plates and spacer plates interleaved with the fin plates in the plate stack. Each fin plate having fin sides extending between a fin lower edge and a fin upper edge. Each spacer plate having spacer sides extending between a spacer lower edge and a spacer upper edge. The fin upper edges of the fin plates located above the spacer upper edges. Air flow channels formed in gaps between the fin plates above the spacer plates. The fin lower edges and the spacer lower edges define a lower thermal interface configured to be in thermal communication with an electrical component to dissipate heat from the electrical component. The fin plates are independently movable relative to the spacer plates in the plate stack to independently articulate the fin lower edges and the spacer lower edges at the lower thermal interface. The heat exchange assembly includes a plate stabilizer structure positioning the fin upper edges relative to each other. The plate stabilizer structure includes plate stabilizers having stabilizing fingers. The stabilizing fingers coupled to at least two fin plates to control spacing of the fin upper edges of the corresponding fin plates.

DETAILED DESCRIPTION OF THE INVENTION

Figure 1:
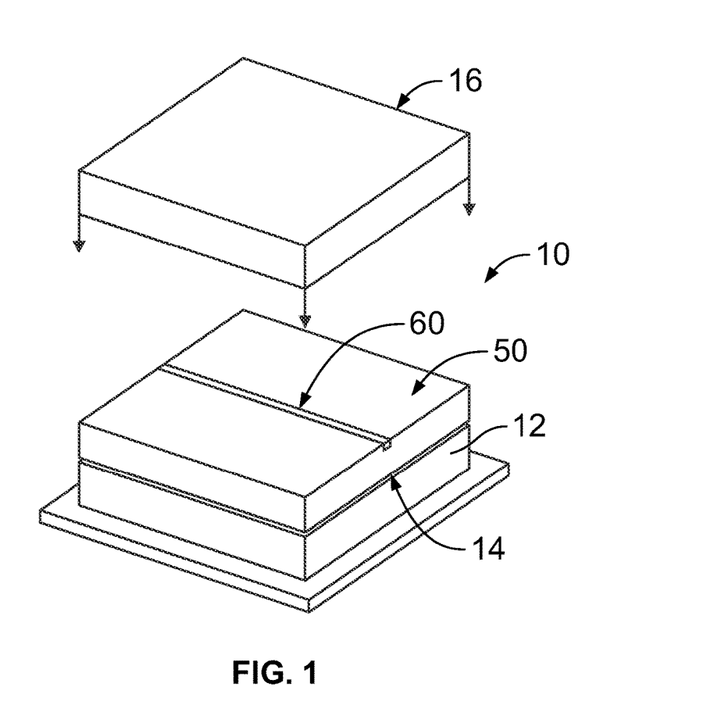
FIG. 1 is a schematic view of a communication system and a heat exchange assembly in accordance with an exemplary embodiment.

FIG. 1 is a schematic view of a communication system 10 and a heat exchange assembly 50 in accordance with an exemplary embodiment for dissipating heat from at least one electrical component 12 of the communication system 10. The heat exchange assembly 50 is configured to be thermally coupled to the electrical component 12 at a lower thermal interface 14 at a bottom of the heat exchange assembly 50. Optionally, the heat exchange assembly 50 may be thermally coupled to a heat transfer device 16, such as a heat sink or cold plate, to dissipate heat from the heat exchange assembly 50. For example, the heat exchange assembly 50 is configured to be thermally coupled to the heat transfer device 16 at an upper thermal interface 18. Alternatively, the heat exchange assembly 50 may dissipate heat into the surrounding environment, such as via airflow over the heat exchange assembly 50. For example, the heat exchange assembly 50 may be a finned heat dissipating structure, configured to be air cooled by transferring heat to the passing airflow.

In an exemplary embodiment, the heat exchange assembly 50 is compressible against the electrical component 12. In an exemplary embodiment, the lower thermal interface 14 is conformable to a shape of the electrical component 12 for efficient thermal transfer therebetween. For example, the heat exchange assembly 50 may include a plate stack having a plurality of plates that are independently movable relative to each other. The plates may be independently articulated against the thermal interface of the electrical component 12. The heat exchange assembly 50 includes a plate stabilizer structure 60 used to stabilize the plates relative to each other. The plate stabilizer structure 60 may control spacing between the plates, such as to reduce side-to-side movement of the plates. The plate stabilizer structure 60 may minimize tilt or lean of the plates. The plate stabilizer structure 60 may maintain spacing of airflow channels between the plates. Optionally, multiple plate stabilizer structures 60 may be used, such as at spaced apart locations. The plate stabilizer structure 60 may be coupled to the top and/or the front and/or the rear of the plate stack. The plate stabilizer structure 60 may be coupled to middle portions of the plates rather than edges of the plates.

In an exemplary embodiment, the electrical component 12 is mounted to a circuit board 20. In various embodiments, the electrical component 12 may be a communication connector, such as a receptacle connector, a header connector, a plug connector, or another type of communication connector. In other various embodiments, the electrical component 12 may be an electronic package, such as an integrated circuit or an ASIC. In other various embodiments, the electrical component 12 may be a pluggable module, such as an I/O transceiver module. Other types of electrical components may be provided in alternative embodiments.

Figure 2:
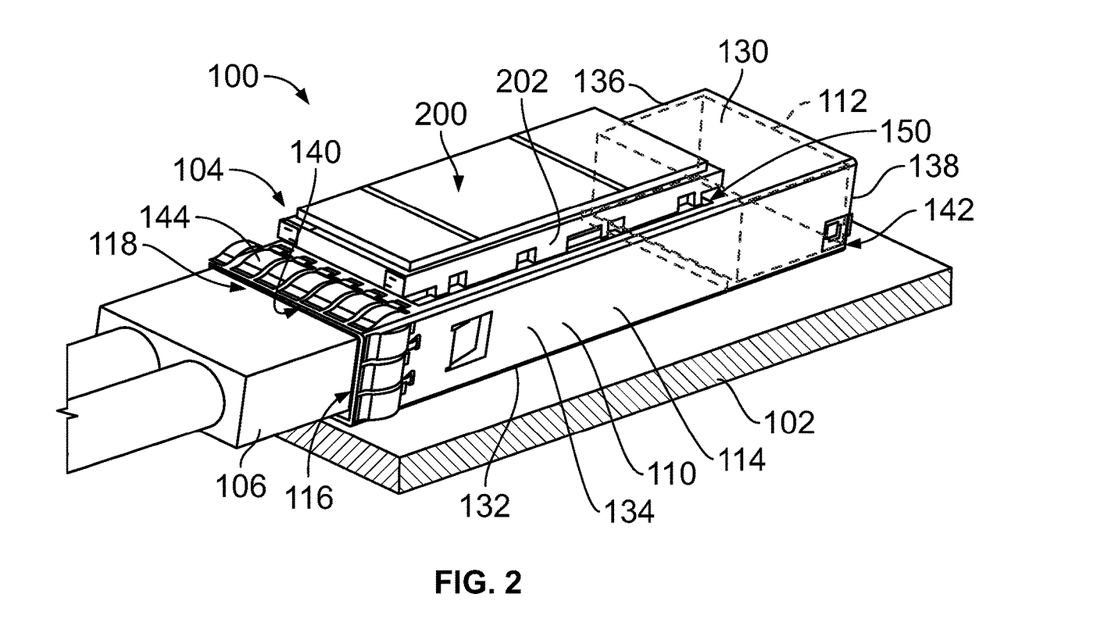
FIG. 2 is a front perspective view of a communication system formed in accordance with an exemplary embodiment.

FIG. 2 is a front perspective view of a communication system 100 formed in accordance with an exemplary embodiment. The communication system is an exemplary embodiment of the communication system 10 shown in FIG. 1. The communication system 100 includes a circuit board 102 and a receptacle connector assembly 104 mounted to the circuit board 102. A pluggable module 106 (shown in FIG. 3) is configured to be electrically connected to the receptacle connector assembly 104. The pluggable module 106 is electrically connected to the circuit board 102 through the receptacle connector assembly 104.

In an exemplary embodiment, the receptacle connector assembly 104 includes a receptacle cage 110 and a communication connector 112 (shown in phantom) adjacent the receptacle cage 110. For example, in the illustrated embodiment, the communication connector 112 is received in the receptacle cage 110. In other various embodiments, the communication connector 112 may be located rearward of the receptacle cage 110. In various embodiments, the receptacle cage 110 encloses and provides electrical shielding for the communication connector 112. The receptacle cage 110 is configured to surround at least a portion of the pluggable module 106 to provide shielding for the pluggable module 106.

The receptacle cage 110 includes a plurality of cage walls 114 surrounding a cavity 116. The cavity 116 may receive the communication connector 112 in various embodiments. The cavity 116 defines one or more module channels 118 for receipt of corresponding pluggable modules 106. The cage walls 114 may be walls defined by solid sheets, perforated walls to allow airflow therethrough, walls with cutouts, such as for a heat sink or heat spreader to pass therethrough, or walls defined by rails or beams with relatively large openings, such as for airflow therethrough. In an exemplary embodiment, the receptacle cage 110 is a metallic shielding, stamped and formed cage member with the cage walls 114 being shielding walls.

In the illustrated embodiment, the receptacle cage 110 includes a single module channel 118 for receiving a single pluggable module 106. The receptacle cage 110 has a port that is open at the front of the receptacle cage 110 to receive the pluggable module 106. Any number of module channels 118 may be provided in various embodiments. For example, the receptacle cage 110 may constitute a stacked cage member having upper and lower module channels 118 to receive multiple pluggable modules 106 in a stacked arrangement in an alternative embodiment. The upper and lower module channels 118 may be arranged in a single column; however, the receptacle cage 110 may include multiple columns of ganged module channels 118 in alternative embodiments (for example, 2×2, 3×2, 4×2, 4×3, etc.). In other various embodiments, rather than being a stacked cage member, the receptacle cage 110 may include ganged module channels 118 in a single row (for example, 1×2, 1×4, etc.). Optionally, multiple communication connectors 112 may be arranged within the receptacle cage 110, such as when multiple columns or rows of module channels 118 are provided.

In an exemplary embodiment, the cage walls 114 of the receptacle cage 110 include a top wall 130, a bottom wall 132, a first side wall 134, a second side wall 136 and a rear wall 138. The top wall 130 includes an opening 150 (shown in FIG. 3) therethrough. The opening 150 provides access to the module channel 118 and the pluggable module 106. The bottom wall 132 may rest on the circuit board 102. However, in alternative embodiments, the receptacle cage 110 may be provided without the bottom wall 132. The receptacle cage 110 extends between a front end 140 and a rear end 142. The port is provided at the front end 140 to receive the pluggable module 106 through the front end 140. The cage walls 114 define the cavity 116. For example, the cavity 116 may be defined by the top wall 130, the bottom wall 132, the side walls 134, 136 and the rear wall 138. Other cage walls 114 may separate or divide the cavity 116 into a plurality of module channels 118, such as stacked or ganged module channels. For example, the cage walls 114 may include a divider (not shown). The divider may be a horizontal divider positioned between upper and lower module channels 118. In other various embodiments, the divider may define a vertical separator panel (not shown), such as parallel to the side walls 134, 136.

In an exemplary embodiment, the communication connector 112 is received in the cavity of the receptacle cage 110, such as proximate to the rear wall 138. However, in alternative embodiments, the communication connector 112 may be located behind the rear wall 138 exterior of the receptacle cage 110 and extend into the cavity 116 to interface with the pluggable module(s) 106. For example, the rear wall 138 may include an opening to receive components therethrough. The communication connector 112 is coupled to the circuit board 102. The receptacle cage 110 is mounted to the circuit board 102 over the communication connector 112.

In an exemplary embodiment, the pluggable module 106 is loaded into the receptacle cage 110 through the front end 140 to mate with the communication connector 112. The shielding cage walls 114 of the receptacle cage 110 provide electrical shielding around the communication connector 112 and the pluggable module 106, such as around the mating interface between the communication connector 112 and the pluggable modules 106. In an exemplary embodiment, the receptacle cage 110 includes an EMI gasket 144, which may be metallic, at the front end 140 to interface with the pluggable module 106. The EMI gasket 144 extends into the module channel 118 to at least partially fill the space between the cage walls 114 and the pluggable module 106 to prevent EMI leakage. The EMI gasket 144 may be electrically connected to the receptacle cage 110 and electrically connected to the pluggable module 106. In various embodiments, the EMI gasket 144 may extend around the exterior of the receptacle cage 110 at the front end 140 to interface with a panel (not shown) and prevent EMI leakage through the panel.

In an exemplary embodiment, the receptacle connector assembly 104 includes a heat exchange assembly 200 for dissipating heat from the pluggable module(s) 106. For example, the heat exchange assembly 200 may be coupled to the top wall 130 to interface with the pluggable module 106 when the pluggable module 106 is loaded into the module channel 118. The heat exchange assembly 200 includes a thermal interface configured to be thermally coupled to the pluggable module 106. In an exemplary embodiment, the heat exchange assembly 200 extends through an opening 150 in the top wall 130 to engage the pluggable module 106 when the pluggable module 106 is received in the module channel 118. In an exemplary embodiment, the heat exchange assembly 200 may be fixed relative to the cage walls 114. For example, the heat exchange assembly 200 may include a frame 202 that fixes the heat exchange assembly 200 to the top wall 130. The heat exchange assembly 200 may be secured to the cage walls 114 by a clip, fasteners, welding, adhesive, or other securing means. The heat exchange assembly 200 may be a finned heat sink having heat dissipating fins at the top to dissipate heat into the air flowing around the heat exchange assembly 200. Other types of heat exchange assembly may be provided in alternative embodiments.

Figure 3:
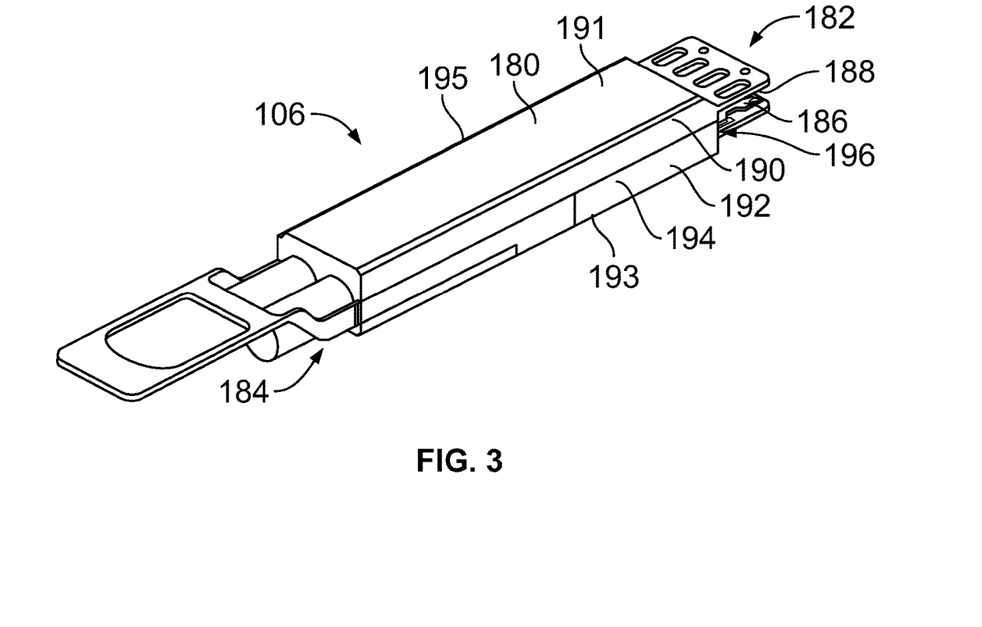
FIG. 3 is a front perspective view of the pluggable module in accordance with an exemplary embodiment.

FIG. 3 is a front perspective view of the pluggable module 106 in accordance with an exemplary embodiment. The pluggable module 106 has a pluggable body 180, which may be defined by one or more shells. For example, the pluggable body 180 may include an upper shell 190 and a lower shell 192. The upper shell 190 includes a top wall 191. The lower shell 192 includes a bottom wall 193. The upper shell 190 and/or the lower shell 192 includes side walls 194, 195. The pluggable body 180 includes a cavity 196 defined between the upper shell 190 and the lower shell 192. In an exemplary embodiment, the pluggable body 180 may be thermally conductive and/or may be electrically conductive, such as to provide EMI shielding for the pluggable module 106. For example, the upper shell 190 and the lower shell 192 may be die cast shells manufactured from metal material, such as aluminum. The pluggable body 180 includes a mating end 182 and an opposite front end 184. The front end 184 may be a cable end having a cable extending therefrom to another component within the system. The mating end 182 is configured to be inserted into the corresponding module channel 118 (shown in FIG. 1).

The pluggable module 106 includes a module circuit board 186 that is configured to be communicatively coupled to the communication connector 112 (shown in FIG. 2). The module circuit board 186 has an edge 188 at the front end 184 configured to be plugged into a card slot of the communication connector 112 (shown in FIG. 2). Contact pads are provided at the edge 188, such as along the upper surface and the lower surface of the module circuit board 186 for electrical connection with contacts of the communication connector 112. The module circuit board 186 is received in the cavity 196 and surrounded by the upper shell 190 and the lower shell 192. The module circuit board 186 may be accessible at the mating end 182. The module circuit board 186 may include components, circuits and the like used for operating and/or using the pluggable module 106. For example, the module circuit board 186 may have conductors, traces, pads, electronics, sensors, controllers, switches, inputs, outputs, and the like associated with the module circuit board 186, which may be mounted to the module circuit board 186, to form various circuits.

In an exemplary embodiment, the pluggable body 180 provides heat transfer for the module circuit board 186, such as for the electronic components on the module circuit board 186. For example, the module circuit board 186 is in thermal communication with the upper shell 190 and/or the lower shell 192. The pluggable body 180 transfers heat from the module circuit board 186. In an exemplary embodiment, the upper shell 190 is configured to interface with the heat exchange assembly 200 (shown in FIG. 2) to dissipate heat from the pluggable module 106. In various embodiments, the pluggable body 180 may include a plurality of heat transfer fins (not shown) along at least a portion of the pluggable module 106, such as the top wall 191. The fins transfer heat away from the main shell of the pluggable body 180, and thus from the module circuit board 186 and associated components. In the illustrated embodiment, the fins are parallel plates that extend lengthwise; however, the fins may have other shapes in alternative embodiments, such as cylindrical or other shaped posts.

Figure 4:
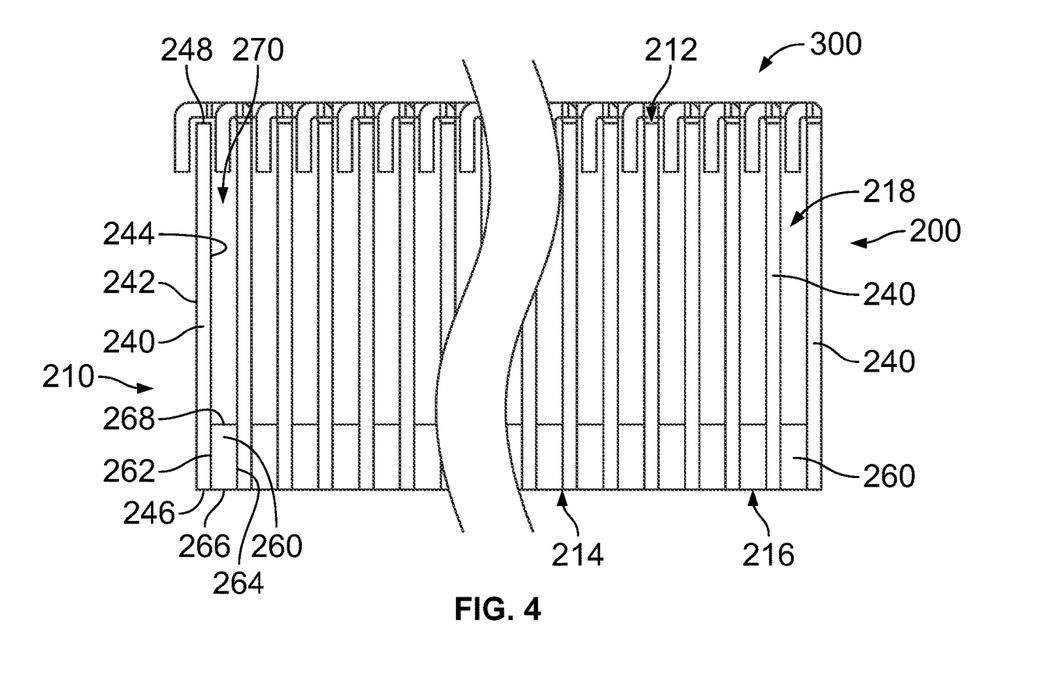
FIG. 4 is a cross sectional view of the heat exchange assembly in accordance with an exemplary embodiment.

FIG. 4 is a cross sectional view of the heat exchange assembly 200 in accordance with an exemplary embodiment. The heat exchange assembly 200 includes a plate stack 210 and a plate stabilizer structure 300 used to stabilize the plates of the plate stack 210. The plate stabilizer structure 300 is used to position the plates relative to each other. The plate stabilizer structure 300 is used to maintain spacing between the plates.

The plate stack 210 extends between a top 212 and a bottom 214. The plate stack 210 has a lower thermal interface 216 at the bottom 214. In an exemplary embodiment, the plate stack 210 is a finned structure at the top 212 having airflow channels 218 that allow airflow through the plate stack 210 to dissipate heat from the plate stack 210. In an exemplary embodiment, the plate stack 210 includes fin plates 240 and spacer plates 260 between the fin plates 240. The spacer plates 260 are interleaved between the fin plates 240. The spacer plates 260 are located at the bottom 214. The airflow channels 218 are defined above the spacer plates 260 between the fin plates 240. In an exemplary embodiment, the fin plates 240 are independently movable relative to the spacer plates 260. As such, the plates within the plate stack 210 are configured to independently articulate relative to each other to allow the lower thermal interface 216 to conform to the thermal interface of the electrical component, such as the pluggable module 106 (shown in FIG. 3). For example, the fin plates 240 and/or the spacer plates 260 may move vertically relative to the adjacent plates to articulate and conform to the top surface of the pluggable module 106. The plate stabilizer structure 300 is used to stabilize the fin plates 240 relative to each other while allowing the fin plates 240 to move and articulate within the plate stack 210.

Each fin plate 240 has fin sides 242, 244 extending between a fin lower edge 246 and a fin upper edge 248. In an exemplary embodiment, the fin plates 240 are generally rectangular plates wherein the sides 242, 244 are parallel to each other. Optionally, the fin lower edge 246 may be generally planar and define a portion of the lower thermal interface 216. Optionally, the fin upper edge 248 may be generally planar. In an exemplary embodiment, the plate stabilizer structure 300 is located at the fin upper edge 248. Optionally, the plate stabilizer structure 300 may extend above the fin upper edge 248. Alternatively, the plate stabilizer structure 300 may be recessed into the plate stack 210 such that the plate stabilizer structure 300 is flush with or recessed below the fin upper edge 248.

Each spacer plate 260 has spacer sides 262, 264 extending between a spacer lower edge 266 and a spacer upper edge 268. In an exemplary embodiment, the spacer plates 260 are generally rectangular plates wherein the sides 262, 264 are parallel to each other. Optionally, the spacer lower edge 266 may be generally planar and define a portion of the lower thermal interface 216. Optionally, the spacer upper edge 268 may be generally planar.

In an exemplary embodiment, the fin plates 240 and the spacer plates 260 are arranged in an alternating sequence to form the plate stack 210. The spacer plates 260 are provided at the bottom 214 of the plate stack 210. The spacer plates 260 are shorter than the fin plates 240. The fin plates 240 extend above the spacer upper edges 268. Gaps 270 are defined between the fin plates 240 above the spacer plates 260. The gaps 270 form the airflow channels 218. Within the plate stack 210, the spacer sides 262, 264 of the spacer plates 260 face the fin sides 242, 244 of the fin plates 240. The plates 240, 260 may abut against each other. In an exemplary embodiment, the plates 240, 260 are slidable relative to each other, such as in vertical directions to allow the plates 240, 260 to move and articulate within the plate stack 210. The fin plates 240 and the spacer plates 260 may be secured together across the plate stack 210, such as using pins that pass through the plate stack 210. As such, the fin plates 240 and a spacer plates 260 are generally coupled together at the bottom 214 of the plate stack 210. The plate stabilizer structure 300 is used to couple the fin plates 240 together at the top 212 of the plate stack 210 and provide stability to the plate stack 210 at the top 212.

Figure 5:
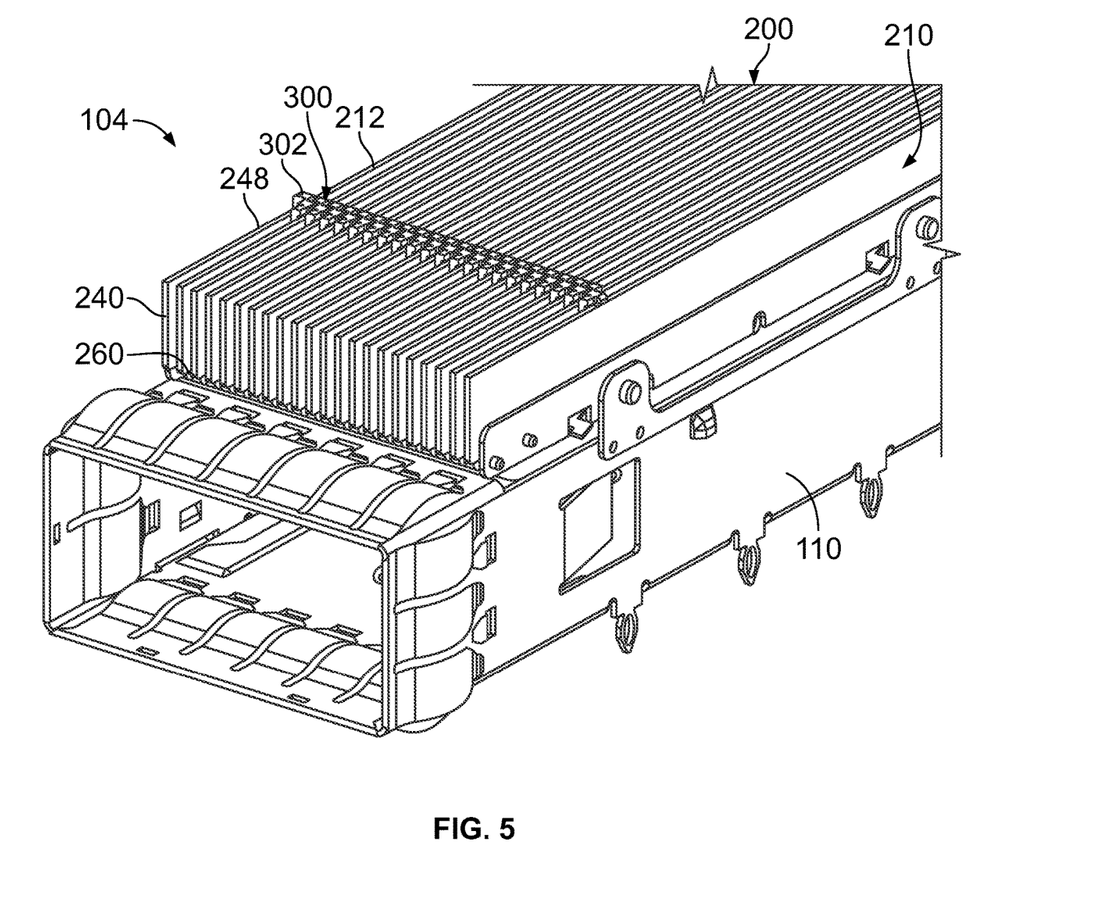
FIG. 5 is a perspective view of the receptacle connector assembly in accordance with an exemplary embodiment.
Figure 6:
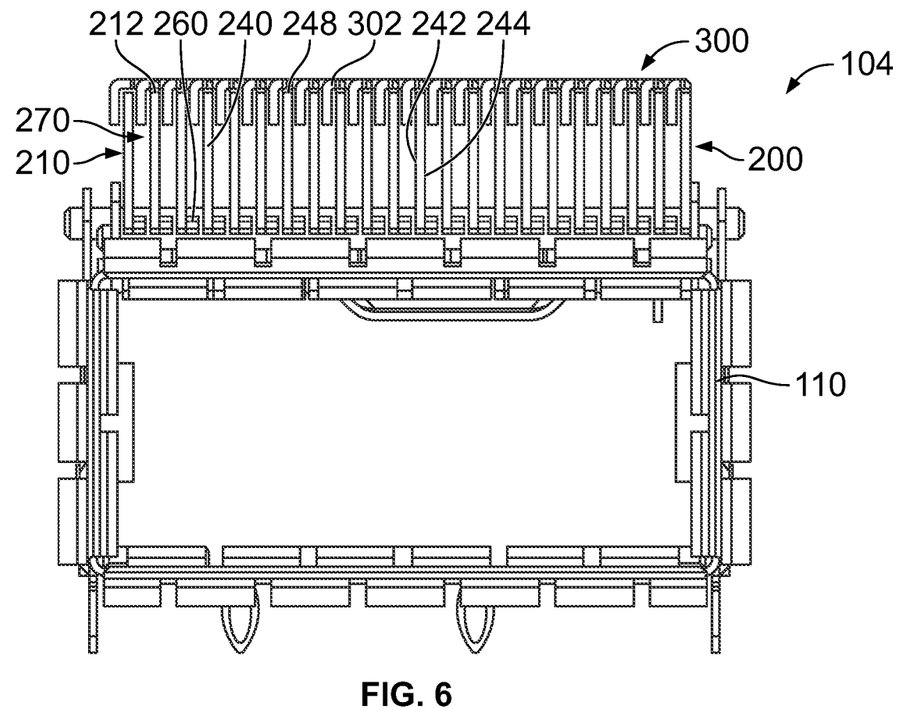
FIG. 6 is a front view of the receptacle connector assembly in accordance with an exemplary embodiment.

FIG. 5 is a perspective view of the receptacle connector assembly 104 in accordance with an exemplary embodiment. FIG. 6 is a front view of the receptacle connector assembly 104 in accordance with an exemplary embodiment. FIGS. 5 and 6 illustrate the heat exchange assembly 200 coupled to the top of the receptacle cage 110. The plate stabilizer structure 300 is positioned relative to the plate stack 210 to provide stability to the fin plates 240 at the top 212 of the plate stack 210.

In an exemplary embodiment, the plate stabilizer structure 300 includes a plurality of plate stabilizers 302 that controls spacing of the fin upper edges 248 relative to each other. In various embodiments, the plate stabilizers 302 may be integral with the fin plates 240. For example, the plate stabilizers 302 may be stamped and formed with the fin plates 240, thus forming unitary, monolithic structures. In other embodiments, the plate stabilizers 302 may be separate and discrete from the fin plates 240 and coupled thereto. In an exemplary embodiment, the plate stabilizers 302 form a comb-like structure that controls spacing between the fin plates 240. Optionally, the plate stabilizers 302 may be separate and discrete from each other and positioned to interface with corresponding fin plates 240. The plate stabilizers 302 may be arranged to nest with each other to form the plate stabilizer structure 300. For example, the plate stabilizers 302 may be arranged in series to span across the entire plate stack 210. In alternative embodiments, the plate stabilizers 302 may be integrated with each other as a single unitary structure coupled to the plate stack 210.

Figure 7:
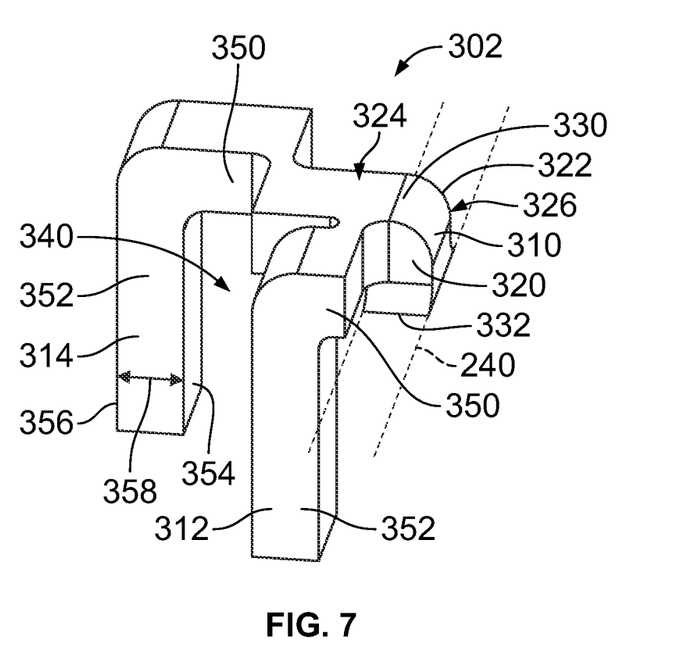
FIG. 7 illustrates the plate stabilizer in accordance with an exemplary embodiment.

With additional reference to FIG. 7 the plate stabilizer 302 is illustrated in accordance with an exemplary embodiment. The plate stabilizer 302 includes a base 310 and one or more stabilizing fingers extending from the base 310. In the illustrated embodiment, the plate stabilizer 302 includes a first stabilizing finger 312 extending from the base 310 and a second stabilizing finger 314 extending from the base 310. The plate stabilizer 302 may include greater or fewer stabilizing fingers in alternative embodiments. The stabilizing fingers 312, 314 are configured to engage corresponding fin plates 240 to position the fin plates 240 relative to each other (for example, to control spacing between the fin upper edges 248).

The base 310 has a front 320 and a rear 322. The base 310 has a first side 324 (for example, left side) and a second side 326 (for example, right side). The base 310 has a top 330 and a bottom 332. In an exemplary embodiment, the fin plate 240 (shown in phantom in FIGS. 7 and 8) extends from the bottom 332. For example, the base 310 may be integral with the fin plate 240 and extend directly from the fin upper edge 248 of the fin plate 240. Alternatively, the base 310 may be coupled to the fin plate 240, such as being welded, adhered, fastened, or otherwise coupled to the fin plate 240.

In an exemplary embodiment, the stabilizing fingers 312, 314 form a stabilizing pocket 340 between the stabilizing fingers 312, 314. The stabilizing pocket 340 is configured to receive the fin upper edge 248 of a corresponding fin plate 240. For example, the first stabilizing finger 312 may extend along the first fin side 242 of the fin plate 240 while the second stabilizing finger 314 may extend along the second fin side 244 of the same fin plate 240. The fin upper edge 248 may be captured between the first and second stabilizing fingers 312, 314 in the stabilizing pocket 340. In the illustrated embodiment, both stabilizing fingers 312, 314 are located at the first side 324. Both stabilizing fingers 312, 314 are configured to interface with fin plates to the same side as the base fin plate 240. However, in alternative embodiments, the stabilizing fingers 312, 314 may extend in different directions, such as extending from both sides 324, 326. In an exemplary embodiment, the stabilizing fingers 312, 314 are staggered or offset relative to each other. For example, the first stabilizing finger 312 is offset forward of the base 310 and the second stabilizing finger 314 is offset rearward of the base 310. The stabilizing fingers 312, 314 may be provided at other locations in alternative embodiments.

In an exemplary embodiment, each stabilizing finger 312 includes a main body 350 and an extension 352. The main body 350 extends from the base 310. The extension 352 extend from the main body 350. The extension 352 extends at an angle from the main body 350. For example, the main body 350 may be oriented horizontally while the extension 352 is oriented vertically. The extension 352 extends into the gap 270 between the fin plates 240. Sides 354, 356 of the extension 352 face the pair of adjacent fin plates 240. The extension 352 has a width 358 between the sides 354, 356. The width 358 controls the spacing between the fin plates 240. It is possible that one or both or neither of the sides 354, 356 engage the fin plates 240 depending on how the fin plates 240 are oriented within the plate stack 210. However, the extensions 352 limit the amount of tilt, compression or extension of the fin plates 240 within the plate stack 210, requiring a minimum spacing between the fin plates 240 by physically separating the fin plates 240 from each other when misalignment occurs. Optionally, the stabilizing finger 312 may include an engagement feature extending from one or both of the sides 354, 356 to interface with the adjacent fin plate 240. The engagement feature may be a dimple, a tab, a rib, or other similar structure. The engagement feature may extend outward to form an interference structure. In various embodiments, the engagement feature has a reduced mating area to reduce friction between the stabilizing finger 312 and the fin plate 240 to allow movement and articulation of the fin plate 240 with limited restriction from the plate stabilizer 302.

Figure 8:
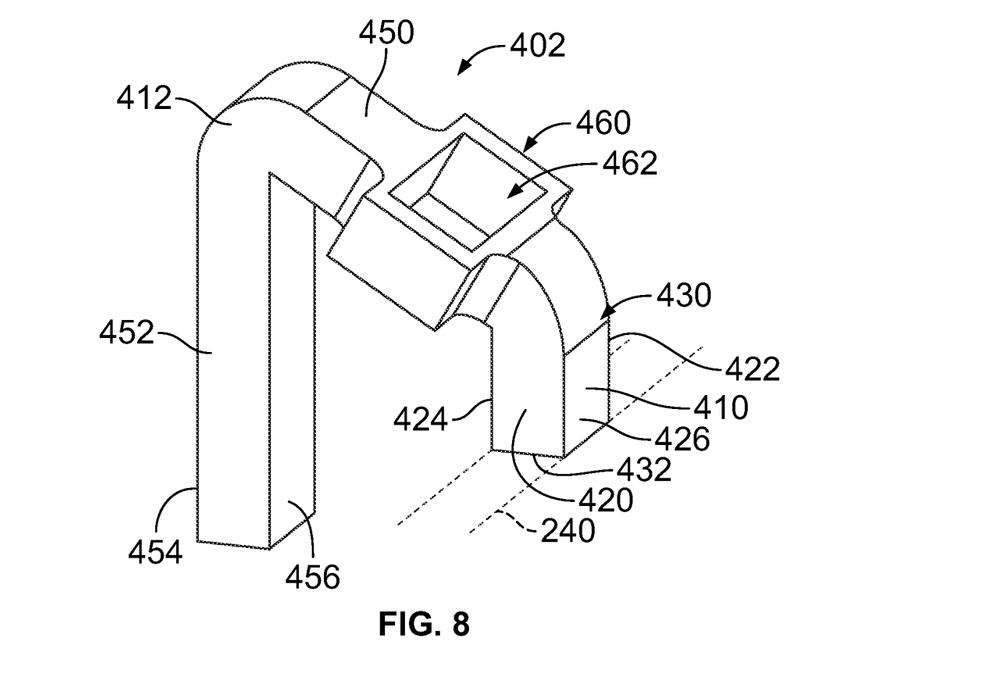
FIG. 8 is a perspective view of a plate stabilizer for a plate stabilizer structure in accordance with an exemplary embodiment.
Figure 9:
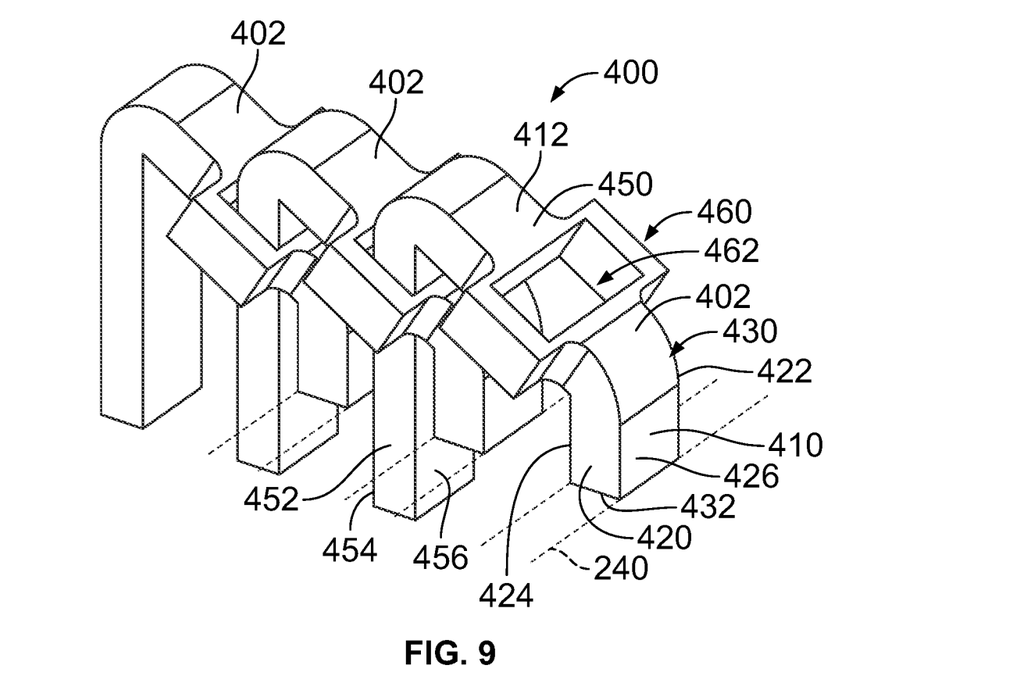
FIG. 9 is a perspective view of a portion of the plate stabilizer structure in accordance with an exemplary embodiment.

FIG. 8 is a perspective view of a plate stabilizer 402 for a plate stabilizer structure 400 in accordance with an exemplary embodiment. FIG. 9 is a perspective view of a portion of the plate stabilizer structure 400 in accordance with an exemplary embodiment. The plate stabilizer structure 400 performs a similar function as the plate stabilizer structure 300; however, the shape and features of the plate stabilizers 402 are different than the plate stabilizers 302 (shown in FIG. 7). The plate stabilizer structure 400 is configured to be positioned relative to the plate stack 210 (shown in FIGS. 5 and 6) to provide stability to the fin plates 240 at the top 212 of the plate stack 210. The plate stabilizers 402 controls spacing of the fin upper edges 248 relative to each other.

In various embodiments, the plate stabilizers 402 may be integral with the fin plates 240. For example, the plate stabilizers 402 may be stamped and formed with the fin plates 240, thus forming unitary, monolithic structures. In other embodiments, the plate stabilizers 402 may be separate and discrete from the fin plates 240 and coupled thereto. In an exemplary embodiment, the plate stabilizers 402 form a comb-like structure that controls spacing between the fin plates 240. Optionally, the plate stabilizers 402 may be separate and discrete from each other and positioned to interface with corresponding fin plates 240. The plate stabilizers 402 may be arranged to nest with each other to form the plate stabilizer structure 400. For example, the plate stabilizers 402 may be arranged in series across the entire plate stack 210 and locked together.

The plate stabilizer 402 includes a base 410 and a stabilizing finger 412 extending from the base 410. The plate stabilizer 402 may include additional stabilizing fingers(s) in alternative embodiments. The base 410 is configured to interface with one fin plate 240 while the stabilizing finger 412 is configured to interface with an adjacent fin plate 240 to position the fin plates 240 relative to each other (for example, to control spacing between the fin upper edges 248).

The base 410 has a front 420 and a rear 422. The base 410 has a first side 424 (for example, left side) and a second side 426 (for example, right side). The base 410 has a top 430 and a bottom 432. In an exemplary embodiment, the fin plate 240 (shown in phantom in FIGS. 9 and 10) extends from the bottom 432. For example, the base 410 may be integral with the fin plate 240 and extend directly from the fin upper edge 248 of the fin plate 240. Alternatively, the base 410 may be coupled to the fin plate 240, such as being welded, adhered, fastened, or otherwise coupled to the fin plate 240.

In an exemplary embodiment, each stabilizing finger 412 includes a main body 450 and an extension 452. The main body 450 extends from the base 410. The extension 452 extend from the main body 450. The extension 452 extends at an angle from the main body 450. In the illustrated embodiment, the main body 450 extends at an angle, such as approximately 45° upward and toward the first side 424 from the base 410 and the extension 452 extends generally vertically downward from the end of the main body 450. The extension 452 is configured to extend into the gap 270 adjacent the fin plate 240. Sides 454, 456 of the extension 452 are configured to face the pair of adjacent fin plates 240.

In an exemplary embodiment, the plate stabilizer 402 includes a locking feature 460. The locking feature 460 is used to lock adjacent plate stabilizers 402 together. For example, the stabilizing finger 412 engages the locking feature 460 of the adjacent plate stabilizer 402. In the illustrated embodiment, the locking feature 460 is a window 462 shaped and positioned to receive the stabilizing finger 412 of the adjacent plate stabilizer 402. The window 462 may be completely surrounded to capture the stabilizing finger 412. Other types of locking features may be used in alternative embodiments, such as a shoulder, a tab, a fastener, or another type of locking feature. When the plate stabilizers 402 are locked together using the locking feature 460, the fin plates 240 are likewise locked together to control spacing between the fin upper edges 248.

Figure 10:
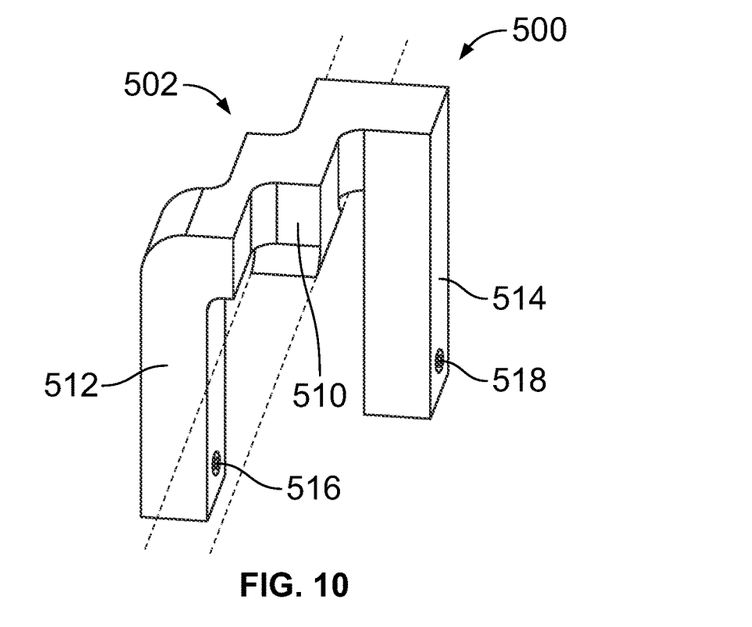
FIG. 10 is a perspective view of a plate stabilizer for a plate stabilizer structure in accordance with an exemplary embodiment.

FIG. 10 is a perspective view of a plate stabilizer 502 for a plate stabilizer structure 500 in accordance with an exemplary embodiment. The plate stabilizer structure 500 performs a similar function as the plate stabilizer structure 300; however, the shape and features of the plate stabilizer 502 are different than the plate stabilizer 302 (shown in FIG. 7). The plate stabilizer structure 500 is configured to be positioned relative to the plate stack 210 (shown in FIGS. 5 and 6) to provide stability to the fin plates 240 at the top 212 of the plate stack 210. The plate stabilizers 502 controls spacing of the fin upper edges 248 relative to each other.

In various embodiments, the plate stabilizer 502 may be integral with the fin plates 240. For example, the plate stabilizer 502 may be stamped and formed with the corresponding fin plate 240, thus forming unitary, monolithic structures. In other embodiments, the plate stabilizer 502 may be separate and discrete from the fin plate 240 and coupled thereto.

The plate stabilizer 502 includes a base 510 and stabilizing fingers 512, 514 extending from the base 510. The stabilizing fingers 512, 514 extend from different sides of the base 510. The base 510 is configured to interface with one fin plate 240 while the first stabilizing finger 512 is configured to interface with an adjacent fin plate 240 to the right and the second stabilizing finger 514 is configured to interface with an adjacent fin plate 240 to the left to position the fin plates 240 relative to each other (for example, to control spacing between the fin upper edges 248). In an exemplary embodiment, the stabilizing fingers 512, 514 include engagement features 516, 518 configured to interface with the fin plates 240. The engagement features 516, 518 have a reduced mating area compared to the flat sides of the stabilizing fingers 512, 514 to reduce friction between the stabilizing fingers 512, 514 and the fin plates 240. The reduced friction allows movement and articulation of the fin plates 240 with limited restriction from the plate stabilizer 502.

Figure 11:
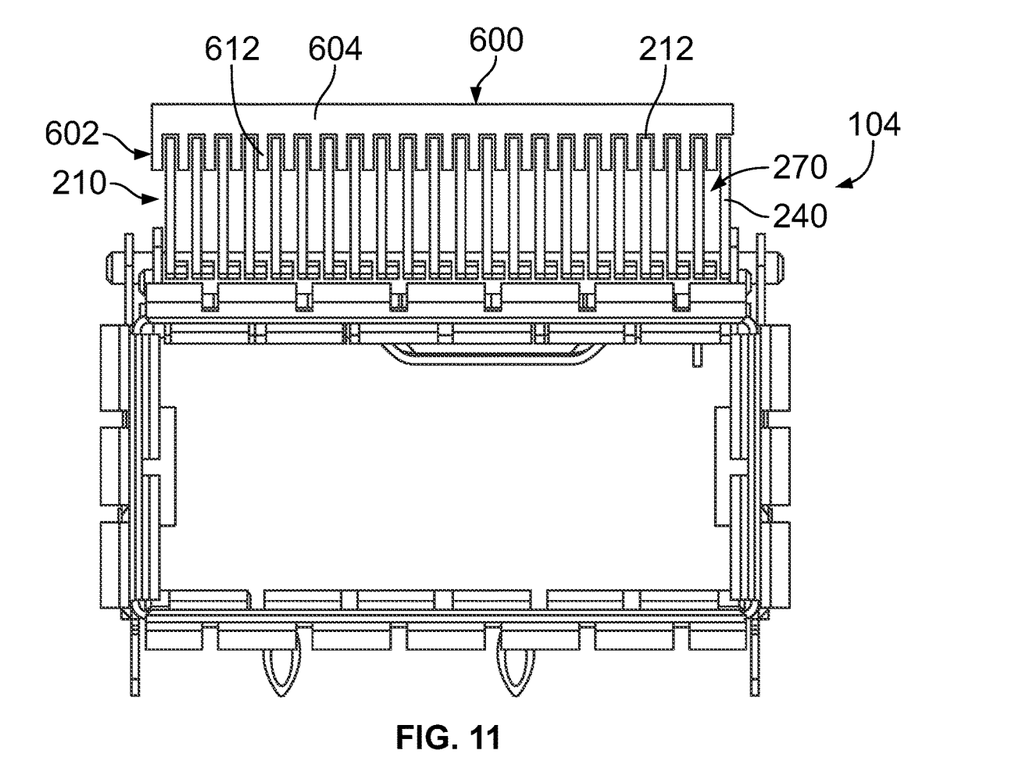
FIG. 11 is a front view of the receptacle connector assembly including a plate stabilizer structure in accordance with an exemplary embodiment.

FIG. 11 is a front view of the receptacle connector assembly 104 including a plate stabilizer structure 600 in accordance with an exemplary embodiment. In the illustrated embodiment, the plate stabilizing structure 600 is a unitary, monolithic structure. The plate stabilizers structure 600 includes a plurality of plate stabilizers 602 interconnected by a crossbeam 604 extending across the plate stabilizer structure 600. The plate stabilizers 602 include stabilizing fingers 612 that extend from the crossbeam 604. The stabilizing fingers 612 are configured to be positioned in the gaps 270 between the fin plates 240. The plate stabilizer structure 600 is separate and discrete from the fin plates 240. The plate stabilizer structure 600 is coupled to the top 212 of the plate stack 210.

Figure 12:
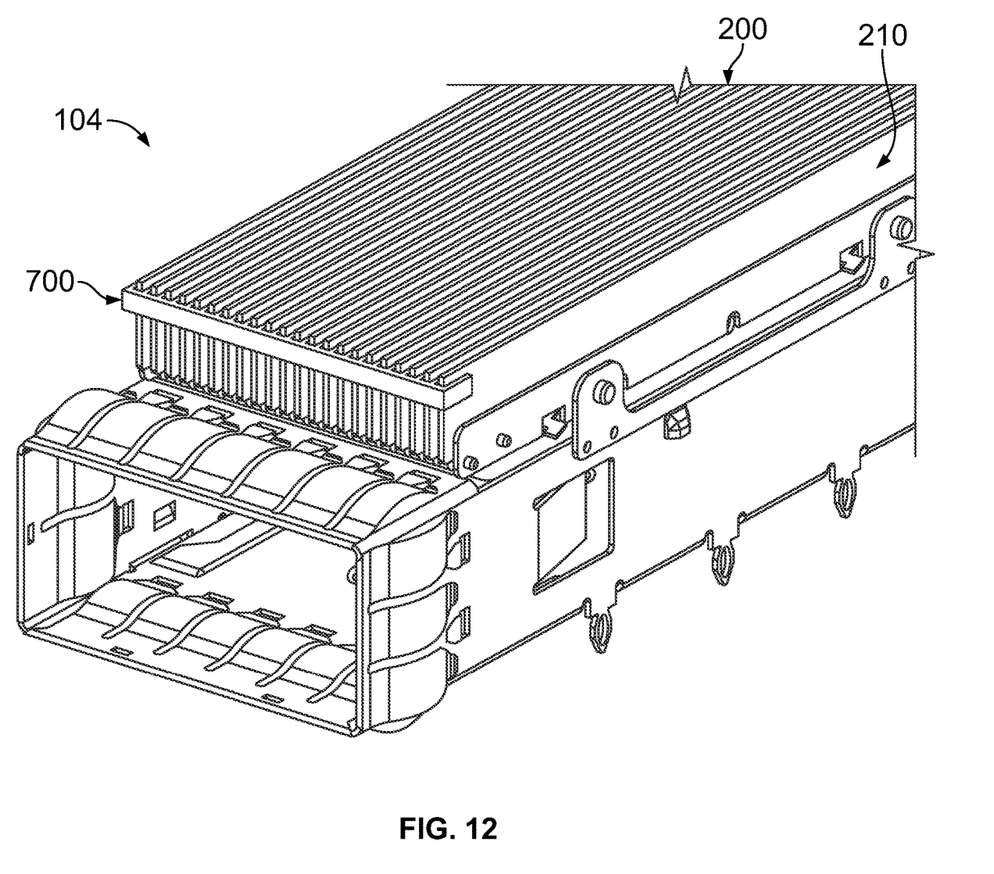
FIG. 12 is a front perspective view of the receptacle connector assembly including a plate stabilizer structure in accordance with an exemplary embodiment.

FIG. 12 is a front perspective view of the receptacle connector assembly 104 including a plate stabilizer structure 700 in accordance with an exemplary embodiment. In the illustrated embodiment, the plate stabilizing structure 700 is provided at the front of the plate stack 210 rather that along the top of the plate stack. Other locations are possible in alternative embodiments, such as at the rear of the plate stack 210. The plate stabilizer structure 700 may be used in addition to one or more of the other plate stabilizer structures, such as the plate stabilizer structure 300 along the top of the plate stack 210.

Figure 13:
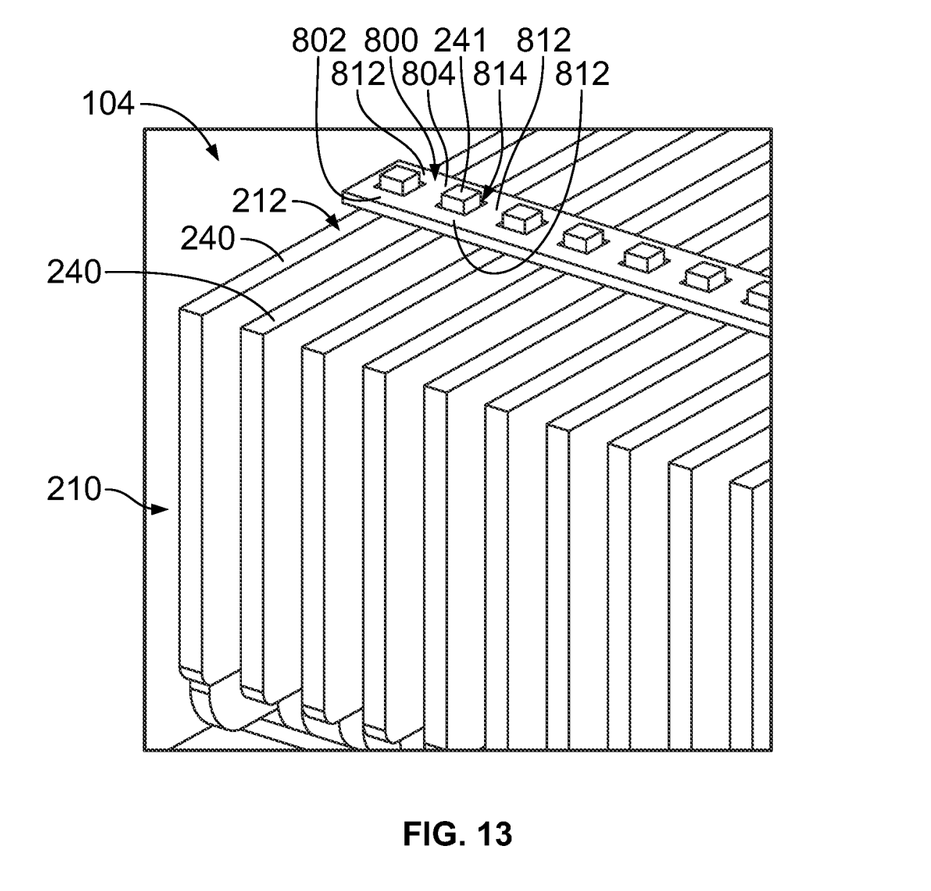
FIG. 13 is a perspective view of a portion of the receptacle connector assembly including a plate stabilizer structure in accordance with an exemplary embodiment.

FIG. 13 is a perspective view of a portion of the receptacle connector assembly 104 including a plate stabilizer structure 800 in accordance with an exemplary embodiment. In the illustrated embodiment, the plate stabilizing structure 800 is a unitary, monolithic structure. The plate stabilizer structure 800 is separate and discrete from the fin plates 240. The plate stabilizer structure 800 extends across the plate stack 210. Optionally, the plate stabilizer structure 800 may be coupled to the top 212 of the plate stack 210. The plate stabilizer structure 800 includes a plurality of plate stabilizers 802 interconnected by crossbeams 804. The plate stabilizers 802 include stabilizing fingers 812 forming stabilizing pockets 814. The stabilizing fingers 812 may completely surround or enclose the stabilizing pockets 814. Alternatively, the stabilizing pockets 814 may be open sided with the stabilizing fingers 812 surrounding the stabilizing pockets 814 on multiple sides, such as three sides. For example, the stabilizing fingers 812 may be U-shaped. The fin plates 240 include tabs 241 received in the stabilizing pockets 814. The plate stabilizer structure 800 receives the tabs 241 to locate the fin plates 240 relative to each other.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "second," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A heat exchange assembly comprising:
a plate stack having a top and a bottom, the plate stack including a fin plates and spacer plates interleaved with the fin plates in the plate stack, each fin plate having fin sides extending between a fin lower edge and a fin upper edge, each spacer plate having spacer sides extending between a spacer lower edge and a spacer upper edge, the fin upper edges of the fin plates located above the spacer upper edges, air flow channels formed in gaps between the fin plates above the spacer plates, the fin lower edges and the spacer lower edges define a lower thermal interface configured to be in thermal communication with an electrical component to dissipate heat from the electrical component, wherein the fin plates are independently movable relative to the spacer plates in the plate stack to independently articulate the fin lower edges and the spacer lower edges at the lower thermal interface; and
a plate stabilizer structure positioning the fin upper edges relative to each other, the plate stabilizer structure including plate stabilizers having stabilizing fingers, the stabilizing fingers coupled to at least two fin plates positioning the fin upper edges of the corresponding fin plates.

2. The heat exchange assembly of claim 1, wherein the plate stabilizers are integral with the corresponding fin plates forming unitary, monolithic structures.

3. The heat exchange assembly of claim 1, wherein the stabilizing fingers extending into the gaps to engage fin sides of the corresponding fin plates.

4. The heat exchange assembly of claim 1, wherein each plate stabilizer includes a single stabilizing finger.

5. The heat exchange assembly of claim 1, wherein each plate stabilizer includes a plurality of the stabilizing fingers.

6. The heat exchange assembly of claim 1, wherein the plate stabilizer structure includes a main body extending across the entire plate stack, the plate stabilizers extending from the main body, the main body maintaining spacing of each of the stabilizing fingers relative to each other.

7. The heat exchange assembly of claim 1, wherein each plate stabilizer includes a base and at least one of the stabilizing fingers extending from the base, the base extending from one of the fin plates and the at least one stabilizing fingers stabilizing another of the fin plates relative to the base.

8. The heat exchange assembly of claim 1, wherein each plate stabilizer includes a base, a first stabilizing finger of the stabilizing fingers, and a second stabilizing finger of the stabilizing fingers, the base extending from a first fin plate of the fin plates, the first stabilizing finger engaging one of the sides of a second fin plate of the fin plates, the second stabilizing finger engaging the other side of the second fin plate.

9. The heat exchange assembly of claim 1, wherein the plate stabilizers are separate and discrete from the fin plates and coupled to the fin plates.

10. The heat exchange assembly of claim 1, wherein the plate stabilizers extend above the fin upper edges, the stabilizing fingers extending into the gaps between the fin plates.

11. The heat exchange assembly of claim 1, wherein each plate stabilizer includes a locking feature, the stabilizing fingers engaging the locking features of the adjacent plate stabilizers to lock the adjacent plate stabilizers together.

12. The heat exchange assembly of claim 11, wherein the locking feature includes a window receiving the stabilizing finger of the adjacent plate stabilizer.

13. The heat exchange assembly of claim 1, wherein the stabilizing fingers are movable relative to the corresponding fin plates to allow the fin plates to independently articulate within the plate stack.

14. The heat exchange assembly of claim 1, wherein the plate stabilizer extends from the side of the corresponding fin plate to engage the sides of the adjacent fin plate.

15. The heat exchange assembly of claim 1, wherein the stabilizing finger includes an engagement feature configured to engage the corresponding fin plate.

16. The heat exchange assembly of claim 1, wherein each plate stabilizer includes spring fingers extending in opposite directions to engage different fin plates.

17. The heat exchange assembly of claim 1, wherein the stabilizing fingers form stabilizing pockets, the fin upper edges being received in corresponding stabilizing pockets.

18. The heat exchange assembly of claim 1, wherein the stabilizing fingers form stabilizing pockets, the fin plates including tabs extending therefrom, the tabs being received in the stabilizing pockets to position the fin plates relative to the plate stabilizer and each other.

19. A heat exchange assembly comprising:
a plate stack having a top and a bottom, the plate stack including a fin plates and spacer plates interleaved with the fin plates in the plate stack, each fin plate having fin sides extending between a fin lower edge and a fin upper edge, each spacer plate having spacer sides extending between a spacer lower edge and a spacer upper edge, the fin upper edges of the fin plates located above the spacer upper edges, air flow channels formed in gaps between the fin plates above the spacer plates, the fin lower edges and the spacer lower edges define a lower thermal interface configured to be in thermal communication with an electrical component to dissipate heat from the electrical component, wherein the fin plates are independently movable relative to the spacer plates in the plate stack to independently articulate the fin lower edges and the spacer lower edges at the lower thermal interface; and
a plate stabilizer structure positioning the fin upper edges relative to each other, the plate stabilizer structure including plate stabilizers, each plate stabilizer including a stabilizing finger engaging the adjacent fin plate maintaining relative positions of the adjacent fin plates, wherein the plate stabilizer is integral with the corresponding fin plate.

20. The heat exchange assembly of claim 19, wherein each plate stabilizer includes a locking feature, the stabilizing fingers engaging the locking features of the adjacent plate stabilizers to lock the adjacent plate stabilizers together.

21. A receptacle connector assembly comprising:
a receptacle cage including cage walls including a top wall, the cage walls forming a module channel configured to receive a pluggable module, the cage walls extending between a front end and a rear end of the receptacle cage, the top wall including an opening open to the pluggable module; and
a heat exchange assembly coupled to the top wall of the receptacle cage to dissipate heat from the pluggable module, the heat exchange assembly including a plate stack having a top and a bottom, the plate stack including a fin plates and spacer plates interleaved with the fin plates in the plate stack, each fin plate having fin sides extending between a fin lower edge and a fin upper edge, each spacer plate having spacer sides extending between a spacer lower edge and a spacer upper edge, the fin upper edges of the fin plates located above the spacer upper edges, air flow channels formed in gaps between the fin plates above the spacer plates, the fin lower edges and the spacer lower edges define a lower thermal interface configured to be in thermal communication with an electrical component to dissipate heat from the electrical component, wherein the fin plates are independently movable relative to the spacer plates in the plate stack to independently articulate the fin lower edges and the spacer lower edges at the lower thermal interface, the heat exchange assembly including a plate stabilizer structure positioning the fin upper edges relative to each other, the plate stabilizer structure including plate stabilizers having stabilizing fingers, the stabilizing fingers coupled to at least two fin plates positioning the fin upper edges of the corresponding fin plates.

\* \* \* \* \*